(12) United States Patent
Miyamae

(10) Patent No.: US 7,186,036 B2
(45) Date of Patent: Mar. 6, 2007

(54) METHOD FOR MANUFACTURING OPTICAL MODULE, OPTICAL COMMUNICATION DEVICE, AND ELECTRONIC DEVICE

(75) Inventor: Akira Miyamae, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/008,201

(22) Filed: Dec. 10, 2004

(65) Prior Publication Data

US 2005/0157986 A1 Jul. 21, 2005

(30) Foreign Application Priority Data

Jan. 20, 2004 (JP) ............................. 2004-011634

(51) Int. Cl.
*G02B 6/36* (2006.01)
(52) U.S. Cl. .......................................... 385/88; 385/93
(58) Field of Classification Search ...................... None
See application file for complete search history.

(56) References Cited

U.S. PATENT DOCUMENTS

| | | | |
|---|---|---|---|
| 6,534,330 B2 | 3/2003 | Sakamoto et al. | |
| 7,103,249 B2 | 9/2006 | Miyamae | |
| 2002/0038851 A1* | 4/2002 | Kajiwara et al. | 250/368 |
| 2002/0118924 A1 | 8/2002 | Murata | |
| 2004/0136725 A1 | 7/2004 | Miyamae et al. | |
| 2004/0179722 A1* | 9/2004 | Moritoki et al. | 382/124 |

FOREIGN PATENT DOCUMENTS

| | | |
|---|---|---|
| JP | A-04-212906 | 8/1992 |
| JP | A-05-121710 | 5/1993 |
| JP | A-07-134223 | 5/1995 |
| JP | A-2000-321469 | 11/2000 |
| JP | A-2002-072021 | 3/2002 |

(Continued)

OTHER PUBLICATIONS

U.S. Appl. No. 10/792,894, filed Mar. 5, 2004, Miyamae et al.

(Continued)

*Primary Examiner*—Sung Pak
*Assistant Examiner*—Hoang Tran
(74) *Attorney, Agent, or Firm*—Oliff & Berridge, PLC

(57) ABSTRACT

To provide methods for manufacturing optical modules that can reduce their manufacturing cost. A method for manufacturing an optical module having an optical element and a supporting member that supports one end of an optical path, disposed opposite to each other through a light-transmissive resin film, comprising: a first step of attaching a plurality of the optical elements to one surface of the light-transmissive resin film; a second step of detecting a position of each of the optical elements by conducting an image recognition processing through imaging each of the optical elements through the light-transmissive resin film from the side of another surface of the light-transmissive resin film; a third step of attaching a plurality of the supporting members on the other surface of the light-transmissive resin film while adjusting an attaching position thereof by using each of the positions of the optical elements detected in the second step as a reference; and a fourth step of obtaining a plurality of the optical modules through cutting the light-transmissive resin film in predetermined regions each including a pair of the optical element and the supporting member.

20 Claims, 8 Drawing Sheets

FOREIGN PATENT DOCUMENTS

| | | |
|---|---|---|
| JP | A-2002-084004 | 3/2002 |
| JP | A-2002-164602 | 6/2002 |
| JP | A-2002-250846 | 9/2002 |
| JP | A-2002-267893 | 9/2002 |
| JP | A-2004-31508 | 1/2004 |
| JP | A2004-287065 | 10/2004 |
| JP | A2004-309570 | 11/2004 |
| JP | A2004-309925 | 11/2004 |
| JP | A2004-319843 | 11/2004 |
| JP | A2004-325939 | 11/2004 |
| JP | A-2004-341102 | 12/2004 |
| JP | A2004-361630 | 12/2004 |

OTHER PUBLICATIONS

U.S. Appl. No. 10/843,480, filed May 12, 2004, Miyamae.

U.S. Appl. No, 10/844,418, filed May 13, 2004, Miyamae et al.

U.S. Appl. No. 10/849,785, filed May 21, 2004, Miyamae.

* cited by examiner

FIG. 1
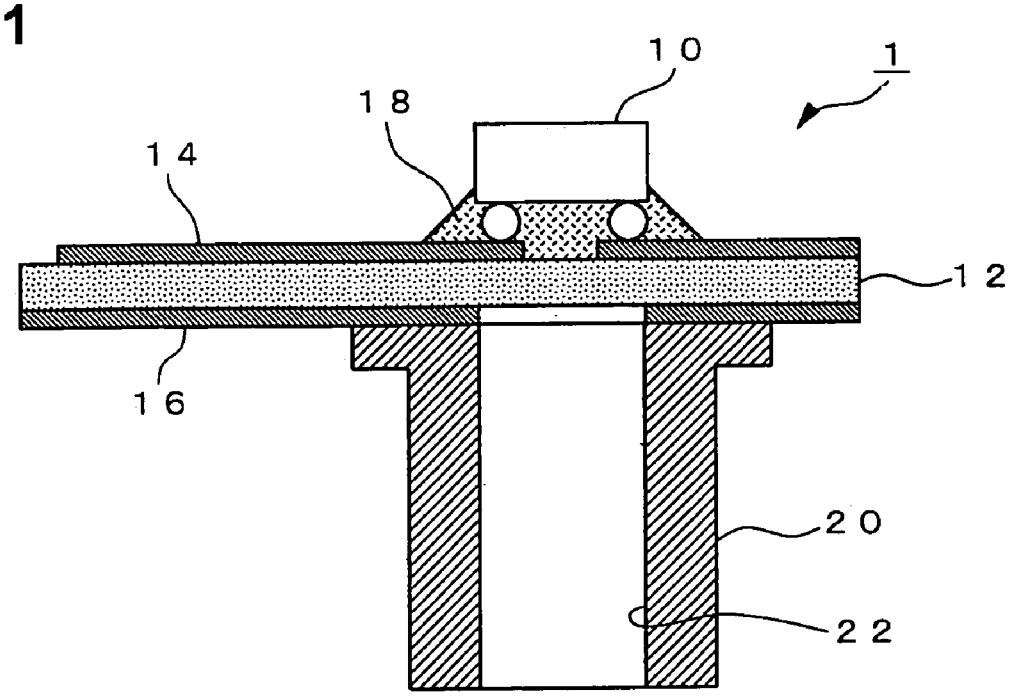
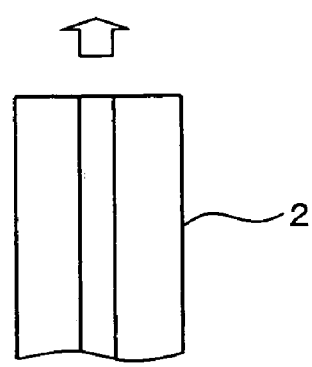

IMAGE RECOGNITION

POSITIONING

IMAGE RECOGNITION     POSITIONING

IMAGE RECOGNITION    IMAGE RECOGNITION

POSITIONING

METHOD FOR MANUFACTURING OPTICAL MODULE, OPTICAL COMMUNICATION DEVICE, AND ELECTRONIC DEVICE

BACKGROUND

The present invention relates to an optical module that is suitable for the use of an optical communication system, and a method for manufacturing the same.

Optical communication technologies that have conventionally been used in infrastructure systems and access systems are being applied to other uses such as high-speed transmission of signals not only in LAN (Local Area Network), but also among circuit chips included in various devices, and circuit substrates. As an optical module that is used in such optical communications, Japanese laid-open patent application 2002-250846 describes an optical module having a structure in which an optical element and an optical path are disposed opposite to each other with a substrate interposed therebetween.

SUMMARY

For optical modules used in optical communications, a further miniaturization is desired as the number of communication lines and the number of channels increase, and a lower cost is desired in order to promote a wider dissemination thereof.

Accordingly, it is an object of the present invention to provide methods for manufacturing optical modules that can reduce their manufacturing cost.

A first embodiment of the present invention pertains to a method for manufacturing an optical module having an optical element and a supporting member that supports one end of an optical path, which are disposed opposite to each other through a light-transmissive resin film, and includes: a first step of attaching a plurality of the optical elements to one surface of the light-transmissive resin film; a second step of detecting a position of each of the optical elements by conducting an image recognition processing through imaging each of the optical elements through the light-transmissive resin film from the side of another surface of the light-transmissive resin film; a third step of attaching a plurality of the supporting members on the other surface of the light-transmissive resin film while adjusting an attaching position thereof by using each of the positions of the optical elements detected in the second step as a reference; and a fourth step of obtaining a plurality of the optical modules through cutting the light-transmissive resin film in predetermined regions each including a pair of the optical element and the supporting member.

A second embodiment of the present invention pertains to a method for manufacturing an optical module having an optical element and a supporting member that supports one end of an optical path, disposed opposite to each other through a light-transmissive resin film, and includes: a first step of attaching a plurality of the supporting members to one surface of the light-transmissive resin film; a second step of detecting a position of each of the supporting members by conducting an image recognition processing through imaging each of the supporting members through the light-transmissive resin film from the side of another surface of the light-transmissive resin film; a third step of attaching a plurality of the optical elements on the other surface of the light-transmissive resin film while adjusting an attaching position thereof by using each of the positions of the supporting members detected in the second step as a reference; and a fourth step of obtaining a plurality of the optical modules through cutting the light-transmissive resin film in predetermined regions each including a pair of the optical element and the supporting member.

In the manufacturing method in accordance with each of the embodiments of the present invention described above, multiple optical elements and supporting members corresponding to multiple optical modules are attached together to a light-transmissive resin film formed in a large sized sheet, and they are finally cut into individual pieces, such that multiple optical modules can be formed together. Accordingly, handling of parts such as optical elements is easier compared to the case where each individual optical module is manufactured through assembling parts that have already been made into individual pieces, and the time-consuming loading and unloading of light-transmissive resin films can be substantially eliminated, such that the manufacturing cost can be reduced. Also, the manufacturing method in accordance with the present invention can be readily accommodated to process automation, and therefore a lower cost can also be achieved in this respect.

Each of the embodiments of the present invention described above may preferably further include a fifth step of filling a refractive index matching material between the optical element and the light-transmissive resin film.

By this, an optical module with a small optical loss can be obtained.

Each of the embodiments of the present invention described above may preferably further include a sixth step of forming a sealing member that entirely covers the optical element.

By this, an optical module with an excellent environment-resistant characteristic can be obtained.

In accordance with each of the embodiments of the present invention described above, the light-transmissive resin film may preferably have a through hole near a position where the optical element and the supporting member are disposed, and, in the sixth step, the sealing member may preferably be formed extending over to both of the surfaces of the light-transmissive resin film through the through hole, while covering the optical element and covering at least a part of the supporting member.

Such a method would likely be accommodated to a batch formation even when forming a sealing member that achieves a strong environment-resistant characteristic.

Each of the embodiments of the present invention described above may preferably further include a seventh step of examining an operation of each of the optical elements prior to the fourth step.

An examination step can be conducted together for multiple optical modules, such that a further reduction in the manufacturing cost can be achieved.

Also, the light-transmissive resin film may be fed in one direction, and the respective steps included in the manufacturing method in accordance with each of the embodiments of the present invention may preferably be conducted in parallel at a plurality of locations along a feeding direction of the light-transmissive resin film. In other words, the respective steps of the present invention are preferably be conducted according to a so-called reel-to-reel system.

In the manufacturing method in accordance with each of the embodiments of the present invention described above, a manufacturing method in a reel-to-reel system can be readily adopted, such that a reduction in the manufacturing cost can be achieved by the mass-production effect.

A third embodiment of the present invention pertains to a method for manufacturing an optical module including a supporting member that supports one end of an optical path, an optical element disposed in an opening defined in the supporting member, and a light-transmissive resin film having one surface on which the supporting member and the optical element are disposed, and includes: a first step of attaching a plurality of the optical elements to one surface of the light-transmissive resin film; a second step of detecting a position of each of the optical elements by conducting an image recognition processing through imaging each of the optical elements through the light-transmissive resin film from the side of another surface of the light-transmissive resin film; a third step of attaching a plurality of the supporting members on the other surface of the light-transmissive resin film while adjusting an attaching position thereof by using each of the positions of the optical elements detected in the second step as a reference; and a fourth step of obtaining a plurality of the optical modules through cutting the light-transmissive resin film in predetermined regions each including a pair of the optical element and the supporting member.

A fourth embodiment of the present invention pertains to a method for manufacturing an optical module including a supporting member that supports one end of an optical path, an optical element disposed in an opening defined in the supporting member, and a light-transmissive resin film having one surface on which the supporting member and the optical element are disposed, and includes: a first step of attaching a plurality of the supporting members to one surface of the light-transmissive resin film; a second step of detecting a position of each of the supporting members by conducting an image recognition processing through imaging each of the supporting members through the light-transmissive resin film from the side of another surface of the light-transmissive resin film; a third step of attaching the optical element on the other surface of the light-transmissive resin film and in each of the openings of the plurality of supporting members while adjusting an attaching position thereof by using each of the positions of the supporting members detected in the second step as a reference; and a fourth step of obtaining a plurality of the optical modules through cutting the light-transmissive resin film in predetermined regions each including a pair of the optical element and the supporting member.

In the manufacturing method in accordance with each of the embodiments of the present invention described above, multiple optical elements and supporting members corresponding to multiple optical modules are attached together to a light-transmissive resin film formed in a large sized sheet, and they are finally cut into individual pieces, such that multiple optical modules can be formed together. Accordingly, handling of parts such as optical elements is easier compared to the case where each individual optical module is manufactured through assembling parts that have already been made into individual pieces, and the time-consuming loading and unloading of light-transmissive resin films can be substantially eliminated, such that the manufacturing cost can be reduced. Also, the manufacturing method in accordance with the present invention can be readily accommodated to process automation, and therefore a lower cost can also be achieved in this respect.

Each of the embodiments of the present invention described above may preferably include a fifth step of filling a refractive index matching material between the optical element and the light-transmissive resin film within the opening of the supporting member.

By this an optical module with a small optical loss can be obtained.

Each of the embodiments of the present invention described above may preferably include a sixth step of examining an operation of each of the optical elements prior to the fourth step.

An examination step can be conducted together for multiple optical modules, such that a further reduction in the manufacturing cost can be achieved.

In each of the embodiments of the present invention described above, the light-transmissive resin film may preferably be fed in one direction, and the respective steps may preferably be conducted in parallel at a plurality of locations along a feeding direction of the light-transmissive resin film. In other words, the respective steps of the present invention are preferably be conducted according to a so-called reel-to-reel system.

In the manufacturing method in accordance with each of the embodiments of the present invention described above, a manufacturing method in a reel-to-reel system can be readily adopted, such that a reduction in the manufacturing cost can be achieved by the mass-production effect.

A fifth embodiment of the present invention also pertains to an optical communication device (optical transceiver) equipped with any one of the optical modules described above. The optical communication device in accordance with the present invention can be used in a variety of electronic devices that perform data communications with external devices using light as a transmission medium, such as, for example, personal computers, so-called PDAs (portable information terminal devices) and the like. It is noted that the "optical communication device" includes not only a device that includes both of a composition for transmitting signal light (such as a light emitting element or the like) and a composition for receiving signal light (such as a photo-detecting element or the like) but also a device that is equipped only with a composition for signal transmission (a so-called optical transmission module) or only with a composition for signal receiving (a so-called photodetecting module).

A sixth embodiment of the present invention also pertains to an electronic device equipped with an optical module or an optical transceiver described above. It is noted here that the "electronic device" generally means a device that achieves a specific function by using an electronic circuit or the like, and is not limited to any particular composition, but a variety of devices, such as, for example, personal computers, PDAs (portable information terminals), electronic notebooks or the like can be enumerated.

BRIEF DESCRIPTION OF THE DRAWINGS

FIG. 1 is a cross-sectional view for describing a composition of an optical module in accordance with a first embodiment of the present invention;

DETAILED DESCRIPTION OF EMBODIMENTS

Figure 2:
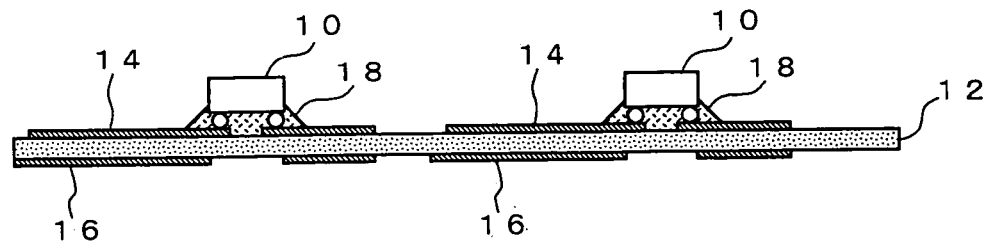
FIGS. 2(A)–2(D) are views for describing a method for manufacturing an optical module in accordance with the first embodiment.
Figure 2:
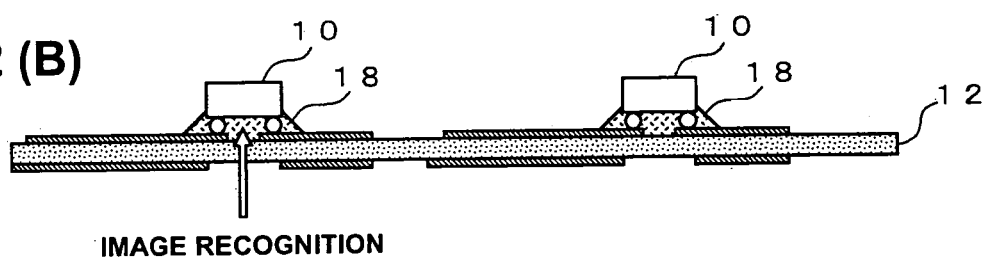
Figure 2:
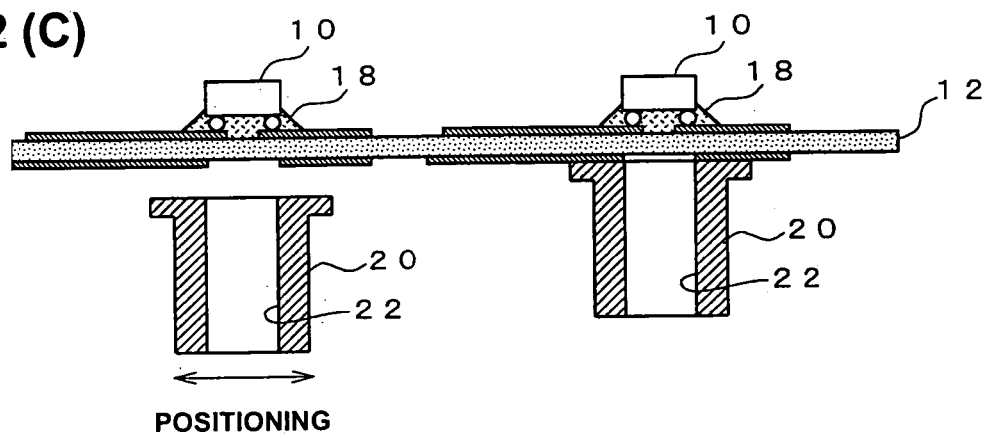
Figure 2:
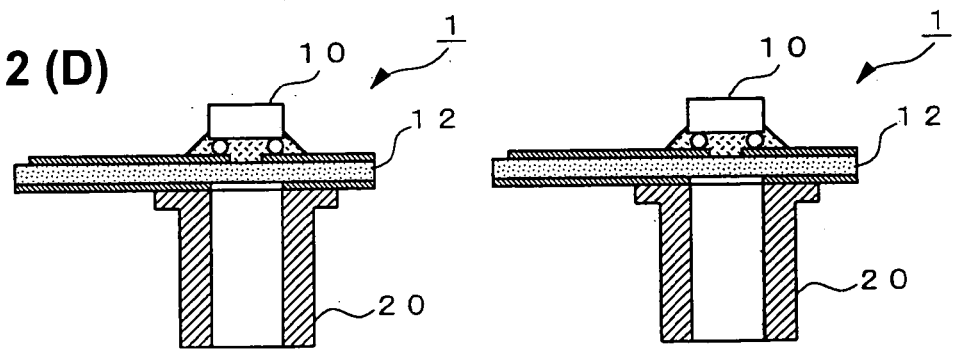

Embodiments of the present invention are described below with reference to the accompanying drawings.

First Embodiment

FIG. 1 is a cross-sectional view for describing a composition of an optical module in accordance with a first embodiment of the present invention. The optical module 1 shown in FIG. 1 has a composition in which an optical element and a supporting member (sleeve) that supports one end of an optical path are disposed opposite to each other with a light-transmissive resin film being interposed between them, and includes an optical element 10, a light-transmissive resin film 12, a first wiring film 14, a second wiring film 16, a refractive index matching material (underfill material) 18, and a sleeve 20.

The optical element 10 is disposed above the light-transmissive resin film 12, and emits signal light toward the optical fiber (optical path) 2 having one end that is supported by the oppositely disposed sleeve 20, or receives signal light emitted from the optical fiber. For example, when the optical module 1 is used on the information transmission side, a light emitting element such as a VCSEL (surface-emitting laser) may be used as the optical element 10. Also, when the optical module 1 is used on the information receiving side, a photodetecting element is used as the optical element 10.

The light-transmissive resin film 12 is interposed between the optical element 10 and the sleeve 20, and supports them. The optical element 10 and the optical fiber 2 that is supported by the sleeve 20 are optically coupled through the light-transmissive resin film 12. The light-transmissive resin film 12 can be formed by using a resin that transmits light, such as, for example, polyimide, epoxy resin or the like. A polyimide film may preferably be used in view of the fact that it has good light permeability, has flexibility, and is easy to handle.

The first wiring film 14 plays a role of transmitting signals between the optical element 10 and an external electronic circuit or the like (not shown), and is formed in a specified configuration (wiring pattern) using a conductive material, such as, copper or the like on an upper surface (one surface) of the light-transmissive resin film 10.

The second wiring film 16 plays a role of transmitting signals between the optical element 10 and an external electronic circuit or the like (not shown), and is formed in a specified configuration (wiring pattern) using a conductive material, such as, for example, copper, on a lower surface (the other surface) of the light-transmissive resin film 10. For example, the second wiring film 16 is connected to a reference potential (grounding potential). More preferably, the second wiring film 16 defines an opening at a portion opposing to a light emitting surface or a photodetecting surface of the optical element 10, and is formed generally over the entire lower surface of the light-transmissive resin film 10.

It is noted that, in order to cope with a high-speed operation of the optical element 10, a micro-strip line may preferably be composed, including the light-transmissive resin film 12, the first wiring film 14 and the second wiring film 16, which is suited for transmission of high-frequency signals. Details thereof in this case are described below.

The underfill material 18 is provided between the optical element 10 and the light-transmissive resin film 12, in order to reduce an optical loss. As the underfill material 18, a resin or the like that has a refractive index close to that of the light-transmissive resin film 12 is used. For example, in the present example, a thermosetting type epoxy material is used as the underfill material 18. By providing the underfill material 18, the optical coupling efficiency is improved because the interface reflection is controlled.

The sleeve 20 is provided to support one end of the optical fiber 2 to dispose it opposite to the optical element 10, and has a through hole 22 that is formed in a configuration that does not generate a substantial gap between itself and the optical fiber 2 as the optical fiber 2 is inserted.

Next, a case where micro-strip lines are composed by including the light-transmissive resin film 12, the first wiring film 14 and the second wiring film 16 is described in detail. When composing the micro-strip line in this manner, its characteristic impedance can be set to a desired value based on the following calculation formula. Namely, when a line width of a transmission path (the first wiring film 14) is B, its line thickness is C, a separation between the transmission path and a grounding (the second wiring film 16 for a grounding potential) is H, and a relative dielectric constant of a dielectric layer (the light-transmissive resin film 12) is $\epsilon r$, the characteristic impedance $z0$ ($\Omega$) of the micro-strip line can be obtained by the following calculation formula.

$$z0=(87/(\epsilon r+1.41)^{1/2}) \times ln(5.98H/(0.8B+C))$$

Here, when the input/output impedance of the optical element 10 is 50 $\Omega$, the characteristic impedance of the micro-strip line can be made to be 50 $\Omega$, such that their impedances are matched and signal attenuation can be prevented. For example, when polyimide with a relative dielectric constant $\epsilon r=3$ is used as the light-transmissive resin film 12, and when B=0.09 mm, H=0.05 mm, and C=0.012 mm, the characteristic impedance $z0$ of the micro-strip line can be about 50 $\Omega$. The light-transmissive resin film 12 may have a thickness of 0.05 mm. If it is thinner than this value, the conductor width becomes too narrow, its DC resistance component may increase, and variations in the impedance value due to variations in the line width may become greater.

Because the optical module 1 of the present embodiment has such a configuration, an optical module that is small and inexpensive can be provided. Also, by interposing the light-transmissive resin film 12, the optical element 10 and the sleeve 20 are separated from each other, such that influences of outside air and moisture from an insertion side of the optical fiber 2 can be prevented, and the sealing property of the optical element can be improved. Next, a method for manufacturing the optical module 1 in accordance with the present embodiment is described.

FIG. 2 are views for describing a method for manufacturing an optical module in accordance with the first embodiment.

Optical Element Mounting Step

As indicated in FIG. 2(A), a light-transmissive resin film 12 is prepared, and a plurality of optical elements 10 are mounted on one surface of the light-transmissive resin film 12. Each of the optical elements 10 is mounted such that its light emitting surface or photodetecting surface is disposed opposite to the light-transmissive resin film 12. The optical elements 10 are connected to predetermined positions of respective first wiring films 14 together by, for example, a flip-chip bonding method. As the light-transmissive resin film 12, for example, a flexible printed substrate (FPC: flexible printed circuit) including a plurality of wiring films corresponding to several—several hundred optical modules is used. In the present embodiment, a flexible printed substrate including micro-strip lines, in which the first wiring films 14 are disposed on one surface of the polyimide film, and second wiring films 16 are disposed on the other surface thereof, is used. The first wiring films 14 and the second wiring films 16 included in the flexible printed substrate may preferably have a thickness of about 12 µm that is formed by electrofoming nickel (Ni) or gold (Au) on copper having a thickness of about 10 µm.

Underfill Material Forming Step

Next, as indicated in FIG. 2(A), underfill material 18 having a refractive index that is generally equal to that of the light-transmissive resin film 12 is filled between the optical element 10 and the light-transmissive resin film 12. In the present example, one-liquid type thermosetting type epoxy material is supplied between the optical element 10 and the light-transmissive resin film 12, and thereafter, it is thermally set to form the underfill material 18.

Image Recognition Step

Next, as indicated in FIG. 2(B), an image recognition processing is conducted by imaging each of the optical elements 10 from the other surface side of the light-transmissive resin film 12 through the light-transmissive resin film 12, to detect a pattern position (configuration) of each of the optical elements 10. Imaging of each of the optical elements 10 is performed by an imaging device, such as, for example, a CCD camera. When a polyimide film is used as the light-transmissive resin film 12, since polyimide is highly transparent to red light to near infrared light, an imaging device that has a high sensitivity to a wavelength range of such light may be used. Also, as an object that is subject to the image recognition processing, any portion of the optical element 10 may be detected as long as that portion can be used as a reference position at the time of mounting the sleeve 20 later, but in particular, a light emitting section or a photodetecting section of each of the optical elements 10 may preferably be detected. When the optical element 10 is a light emitting element, it may be energized to emit light, and such a light emitting position may preferably be detected by the image recognition processing.

Sleeve Mounting Step

Next, as indicated in FIG. 2(C), by using the position of each of the optical elements 10 detected in the aforementioned step as a reference, mounting position is adjusted, and each of the sleeves 20 is attached to a position corresponding to each of the optical elements 10 on the other surface of the light-transmissive resin film 12. In the aforementioned step, if a light emitting section or a photodetecting section of the optical element 10 is to be detected, the mounting position of the sleeve 20 is adjusted such that the light emitting section or the like and a center axis (center) of the through hole 22 of the sleeve 20 generally match with each other. The optical fiber 2 is positioned and optically coupled with the optical element 10 when inserted in the through hole 22 of the sleeve 20. Therefore, by attaching the sleeve 20 by using the position of the optical element 10 as a reference in a manner that the reference and the center of the through hole 22 of the sleeve 2 generally match with each other, an optical axis of the optical fiber 2 and the optical element 10 can be readily adjusted. The sleeve 20 may be attached by, for example, thermocompression bonding with a thermosetting type adhesive sheet interposed between the sleeve 20 and the light-transmissive resin film 12. This method is convenient because the adhesive does not overflow, compared to the case where a liquid adhesive is used, and the mounting is done in a simple and strong fashion.

Examining Step

Next, depending on the requirements, the operation of each of the optical elements 10 is checked (examined). The optical element 10 is supplied with electricity through each of the wiring films, thereby conducting a variety of desired examinations such as evaluation of light emitting condition, photodetecting condition, and the like. Because the examination is conducted prior to dividing the optical modules into individual pieces, the electricity can be supplied to each of the optical elements 10 together, and therefore the work required for evaluations can be substantially shortened. It is noted that, instead of supplying electricity together, electricity can be supplied individually to each of the optical elements 10 by using a probe or the like. Even in this case, the process can be readily accommodated to automation, such that the examination can be conducted in a shorter time compared to the case of an individual evaluation that is conducted after the optical modules 1 have been separated into individual pieces.

Cutting Step

Next, as indicated in FIG. 2(D), the light-transmissive resin film 12 is cut in regions corresponding to a plurality of the respective optical modules 1, in other words, in regions each including a pair of the optical element 10 and the sleeve 20, to obtain a plurality of the optical modules 1. Cutting in the present step can be conducted by dicing, laser cutting or the like. Through the steps described above, the optical module 1 in accordance with the present embodiment is completed.

Circuits (a signal transmission IC, a signal reception IC or the like) for driving the optical element 10 are mounted for the optical module 1 described above, or the optical module 1 described above is mounted on a circuit substrate having these circuits mounted thereon, to thereby compose an optical transceiver (an optical communication device). The optical module and the optical communication device in accordance with the present invention can be used for various types of electronic devices that perform data communications with external devices or the like using light as a transmission medium, such as, for example, personal computers, PDAs (portable information terminal devices) and the like.

It is noted that, according to the manufacturing method described above with reference to FIG. 2, the optical element 10 is first mounted, and then the configuration of the optical element 10 is recognized and the sleeve 20 is mounted while matching their relative positions. However, the order of mounting the optical element 10 and the sleeve 20 can be reversed. A manufacturing method in this case is described below. It is noted that descriptions of contents that duplicate those of the manufacturing method described above may be omitted.

Figure 3:
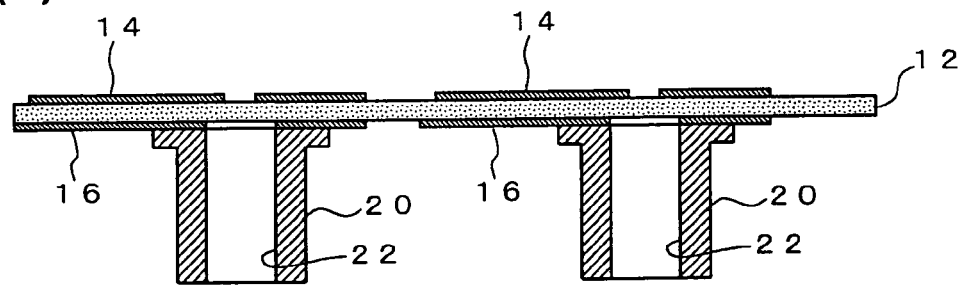
FIGS. 3(A)–3(D) are views for describing another example of a method for manufacturing an optical module in accordance with the first embodiment.
Figure 3:
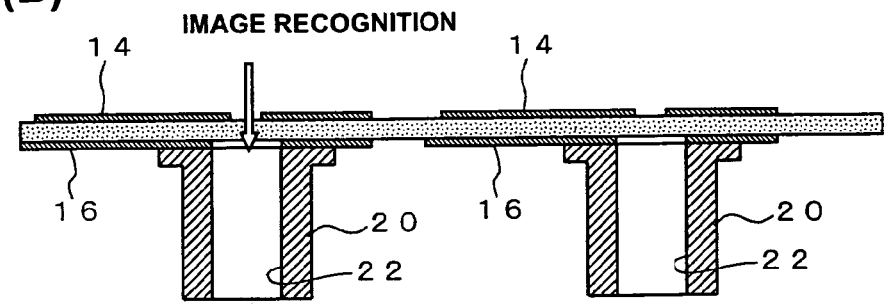
Figure 3:
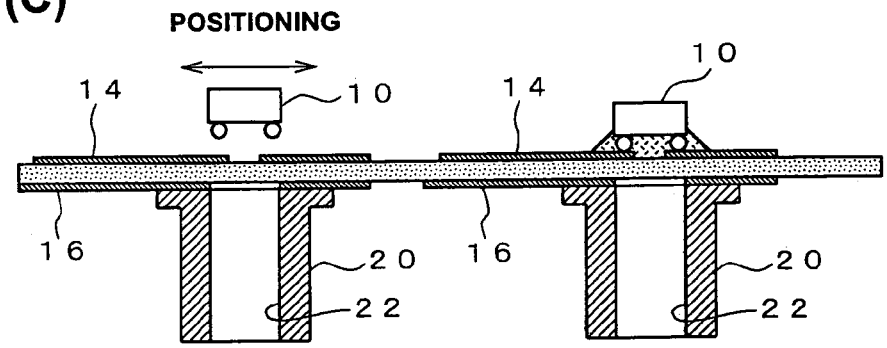
Figure 3:
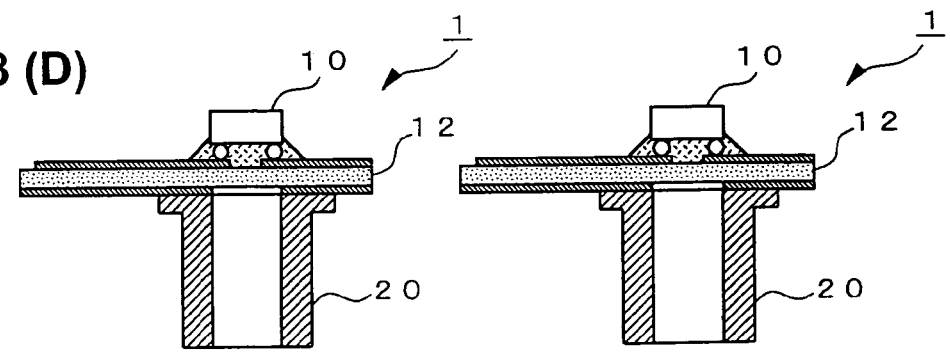

FIG. 3 are views for describing another example of the method for manufacturing an optical module in accordance with the first embodiment.

Sleeve Mounting Step

As indicated in FIG. 3(A), a light-transmissive resin film 12 is prepared, and a plurality of sleeves 20 are mounted on a lower surface (one surface) of the light-transmissive resin film 12.

Image Recognition Step

Next, as indicated in FIG. 3(B), an image recognition processing is conducted by imaging each of the sleeves 20 from the other surface (an upper surface) side of the light-transmissive resin film 12 through the light-transmissive resin film 12, to detect a pattern position (configuration) of each of the sleeves 20. As an object that is subject to the image recognition processing, any portion of the sleeve 20 may be detected as long as that portion can be used as a reference position at the time of mounting the optical element 10 later, but in particular, a through hole 22 of each of the sleeves 20 may preferably be detected.

Optical Element Mounting Step

Next, as indicated in FIG. 3(C), by using the position of each of the sleeves 20 detected in the aforementioned step as a reference, mounting position is adjusted, and each of the optical elements 10 is attached to a position corresponding to each of the sleeves 20 on the other surface of the light-transmissive resin film 12. In the aforementioned step, if the through hole 22 of the sleeve 20 is to be detected, the mounting position of each of the optical elements 10 is adjusted such that a center axis (center) of the through hole 22 and a light emitting section or a photodetecting section of the optical element 10 generally match with each other. The optical fiber 2 is positioned and optically coupled with the optical element 10 when inserted in the through hole 22 of the sleeve 20. Therefore, by attaching the optical element 10 by using the position of the through hole 22 of the sleeve 20 as a reference in a manner that the reference and the light emitting section or the like of the optical element 10 generally match with each other, optical axes of the optical fiber 2 and the optical element 10 can be readily adjusted.

Underfill Material Forming Step

Then, underfill material 18 having a refractive index that is generally equal to that of the light-transmissive resin film 12 is filled between the optical element 10 and the light-transmissive resin film 12.

Examination Step

Next, depending on the requirements, the operation of each of the optical elements 10 is checked (examined).

Cutting Step

Next, as indicated in FIG. 3(D), the light-transmissive resin film 12 is cut in regions corresponding to a plurality of the respective optical modules 1, in other words, in regions each including a pair of the optical element 10 and the sleeve 20, to obtain a plurality of the optical modules 1. By the manufacturing method described above, the optical module 1 in accordance with the present embodiment can be obtained.

Also, the optical module 1 described above may preferably be provided with a sealing member to cover generally the entire optical element 10 to protect it from the external environment. One example of a manufacturing method in this case is described below. It is noted that descriptions of contents that duplicate those of the manufacturing method described above may be omitted.

Figure 4:
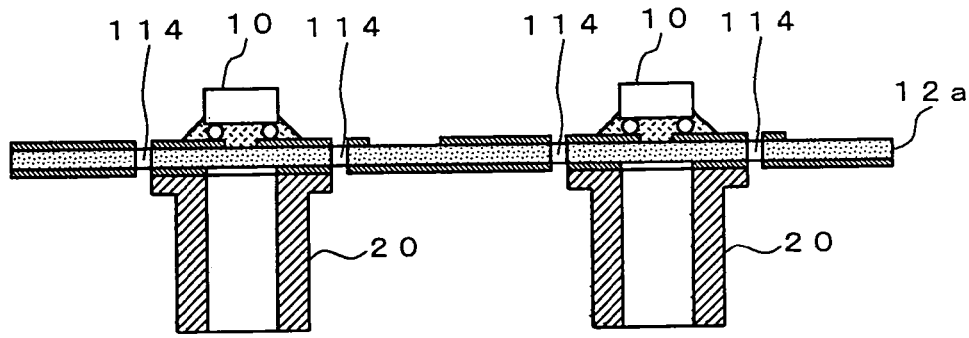
FIGS. 4(A)–4(C) are views for describing another example of a method for manufacturing an optical module in accordance with the first embodiment.
Figure 4:
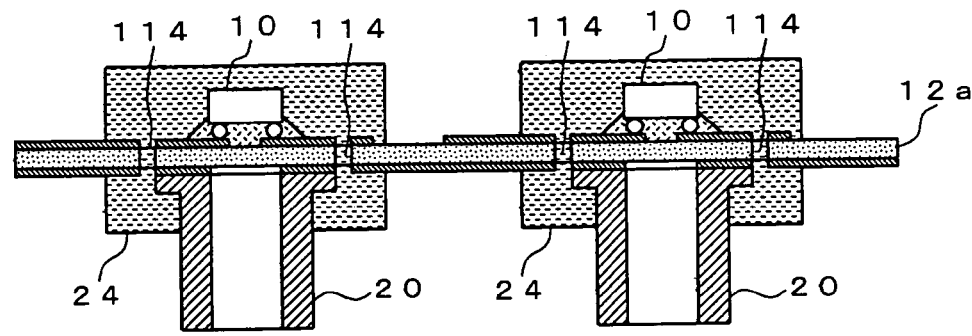
Figure 4:
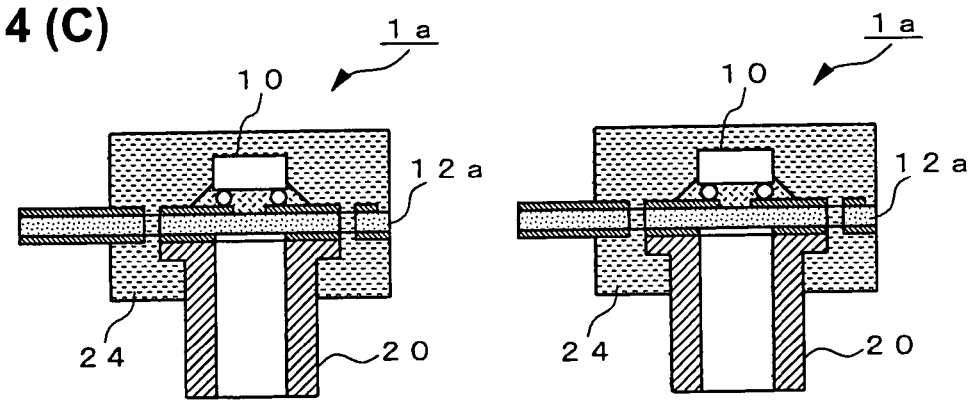

FIG. 4 are views for describing another example of the method for manufacturing an optical module in accordance with the first embodiment.

First, like the steps described above shown in FIG. 2(A)–FIG. 2(C), or FIG. 3(A)–FIG. 3(C), optical elements 10 and sleeves 20 are mounted. In the present example, for the convenience of forming sealing members to be conducted later, a light-transmissive resin film 12a, which has through holes 114 provided adjacent to the positions where the optical elements 10 and the sleeves 20 are to be disposed, is used (FIG. 4(A)).

Sealing Member Forming Step

Next, as indicated in FIG. 4(B), a sealing member 24 is formed in a manner to cover the entirety of the optical element 10. As illustrated, the sealing member 24 of the present example covers the optical element 10 and at least a part of the sleeve 20, and is formed extending over to both of the surfaces of the light-transmissive resin film 12 through the through holes 114. The sealing member 24 may be formed by insert molding of resin, for example. By providing the through holes 114 through which resin material can pass at the time of insert molding, the sealing member 24 that extends over to both of the surfaces of the light-transmissive resin film 12 can be readily formed. Furthermore, by forming the sealing member 24 to cover at least a portion of the sleeve 20, a strong sealing can be provided.

In this manner, in the manufacturing method in accordance with the present embodiments, multiple optical elements and supporting members corresponding to multiple optical modules are attached together to a light-transmissive resin film formed in a large sized sheet or the like, and they are finally cut into individual pieces, such that the multiple optical modules can be formed together. Accordingly, handling of parts such as optical elements is easier compared to the case where each individual optical module is manufactured through assembling parts that have already been made into individual pieces, and the time-consuming loading and unloading of light-transmissive resin films can be substantially eliminated, such that the manufacturing cost can be reduced. Also, the manufacturing method in accordance with the present invention can be readily accommodated to process automation, and therefore a lower cost can also be achieved in this respect.

Moreover, the manufacturing method in accordance with the present embodiment is readily accommodated to a so-called reel-to-reel system, in which the light-transmissive resin film is fed in one direction, and the respective steps described above are conducted in parallel at a plurality of locations along a feeding direction of the light-transmissive resin film.

Figure 5:
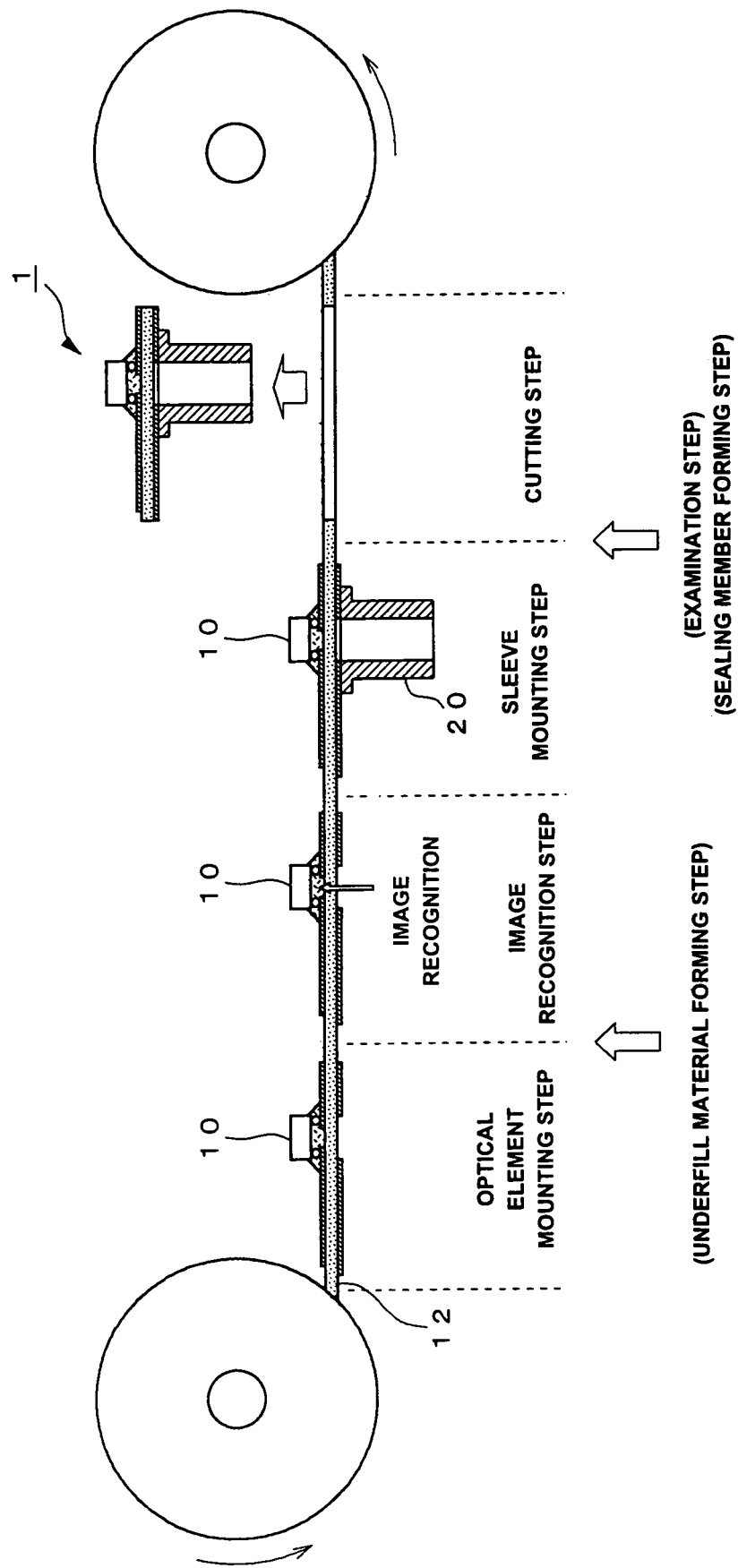
FIG. 5 is a view for describing an example of a manufacturing method when a so-called reel-to-reel system is used.

FIG. 5 is a view for describing an example of a manufacturing method when a so-called reel-to-reel system is used. FIG. 5 schematically shows an example in which the manufacturing steps described above with reference to FIG. 2 are applied to a reel-to-reel system. It is noted that the manufacturing methods described with reference to FIG. 3 and FIG. 4 can also be applied to a reel-to-reel system. As indicated in FIG. 5, a light-transmissive resin film 12 may be fed intermittently or continuously in one direction, and the optical element mounting step, the image recognition step, the sleeve mounting step and the cutting step are conducted in parallel at respective locations along the feeding direction. Also, if necessary, the underfill member forming step may be added after the optical element mounting step, and/or the examination step and the sealing member forming step may be added before the cutting step.

Second Embodiment

Figure 6:
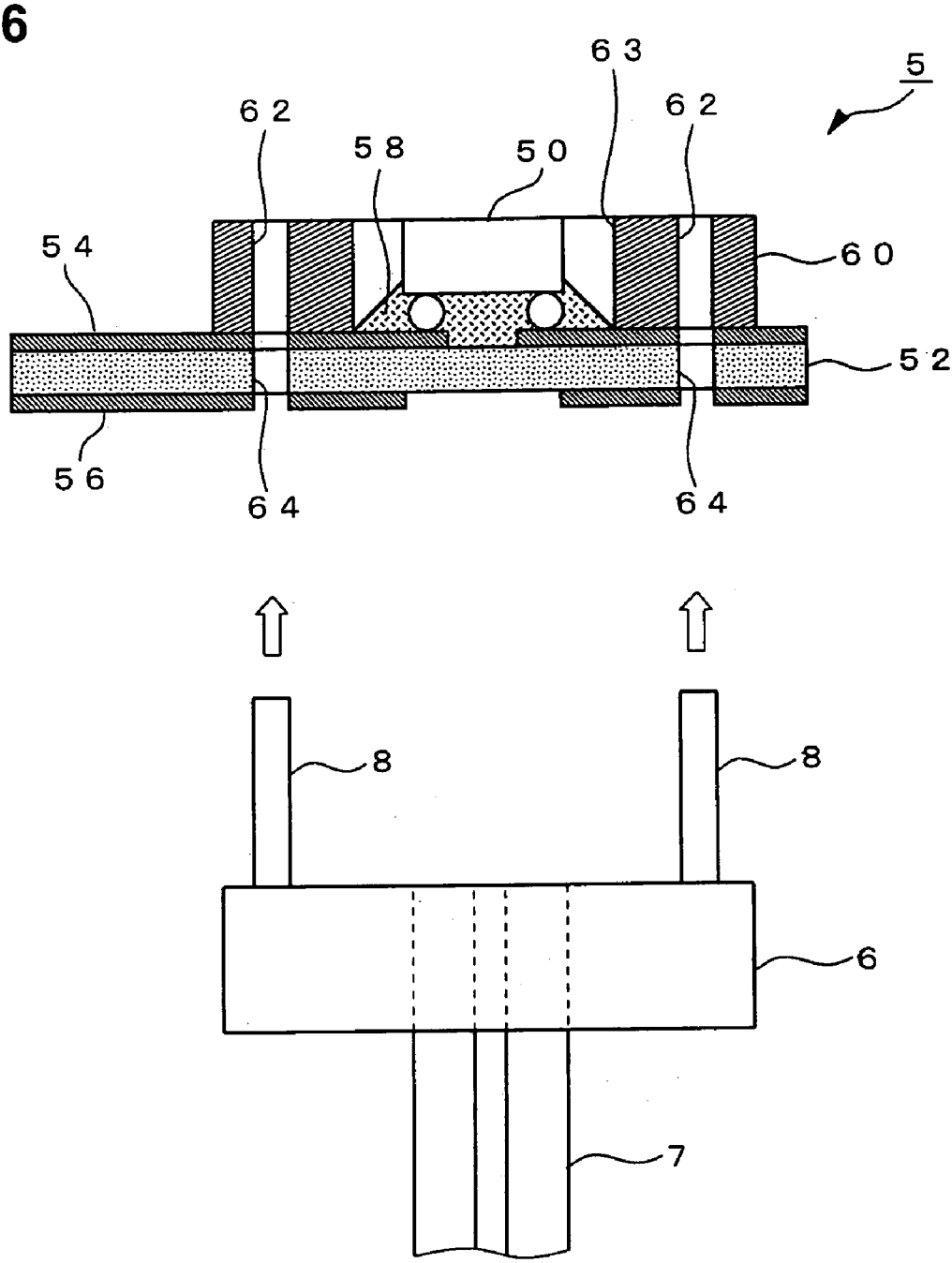
FIG. 6 is a cross-sectional view for describing a composition of an optical module in accordance with a second embodiment of the present invention.

FIG. 6 shows a cross-sectional view for describing a composition of an optical module in accordance with a second embodiment. The optical module 5 shown in FIG. 6 may be composed of a supporting member (receptacle) that supports one end of an optical path, an optical element that is disposed in an opening defined in the supporting member, and a light-transmissive resin film having one surface on which the supporting member and the optical element are disposed, and includes an optical element 50, a light-transmissive resin film 52, a first wiring film 54, a second wiring film 56, a refractive index matching material (underfill material) 58, and a receptacle 60. The optical module 5 of the present example has a structure that corresponds to the standard generally called a MT connector. In other words, the optical module 5 of the present example is assembled with a ferrule 6 that is provided at one end of a tape fiber 7 which is an optical path, to thereby compose a pair of MT connectors. Two or more pins 8 are provided on the side of the ferrule 6, and through holes 62 and 64 to be engaged with those pins 8 are provided on the side of the optical module 5. By engaging those pins and the through holes, the optical element 50 and the tape fiber 7 are relatively positioned with one another.

The optical element 50 is disposed inside an opening 63 of the receptacle 60 and on the light-transmissive resin film 52, and emits signal light toward the tape fiber (optical path) 7 having one end that is supported by the ferrule 6 disposed opposite thereto, or receives signal light emitted from the tape fiber. For example, when the optical module 5 is used on the information transmission side, a light emitting element such as a VCSEL (surface-emitting laser) may be used as the optical element 50. The optical element 50 may be a VCSEL array that includes a plurality of VCSELs. Also, when the optical module 5 is used on the information receiving side, a photodetecting element is used as the optical element 50. The optical element 50 may be a PD array including a plurality of photodetecting elements (PDs).

The light-transmissive resin film 52 has one surface on which the optical element 50 and the receptacle 60 are disposed, and supports them. The optical element 50 and the tape fiber 7 are optically coupled through the light-transmissive resin film 52. The light-transmissive resin film 52 can be formed by using a resin that can transmit light, such as, for example, polyimide, epoxy resin or the like. A polyimide film may preferably be used in view of the fact that it has good light permeability, has flexibility, and is easy to handle.

The first wiring film 54 plays a role of transmitting signals between the optical element 50 and an external electronic circuit or the like (not shown), and is formed in a specified configuration (wiring pattern) using a conductive material, such as, for example, copper on an upper surface (one surface) of the light-transmissive resin film 50.

The second wiring film 56 plays a role of transmitting signals between the optical element 50 and an external electronic circuit or the like (not shown), and is formed in a specified configuration (wiring pattern) using a conductive material, such as, for example, copper, on a lower surface (the other surface) of the light-transmissive resin film 50. For example, the second wiring film 56 is connected to a reference potential (grounding potential). More preferably, the second wiring film 56 defines an opening at a portion opposing to a light emitting surface or a photodetecting surface of the optical element 50, and is formed generally over the entire lower surface of the light-transmissive resin film 52.

It is noted that, in order to cope with a high-speed operation of the optical element 50, a micro-strip line may preferably be composed, including the light-transmissive resin film 52, the first wiring film 54 and the second wiring film 56, which is suitable for transmission of high-frequency signals.

The underfill material 58 is provided in the opening 63 of the receptacle 60 between the optical element 50 and the light-transmissive resin film 52, which is provided to reduce an optical loss. As the underfill material 58, a resin or the like that has a refractive index close to that of the light-transmissive resin film 52. For example, in the present example, a thermosetting type epoxy material is used as the underfill material 58. By providing the underfill material 58, the optical coupling efficiency is improved because the interface reflection is controlled.

The receptacle 60 supports the ferrule 6 provided at one end of the tape fiber 7 and disposes the tape fiber 7 and the optical element 50 opposite to each other, and has through holes 62 that are to be engaged with the pins 8 of the ferrule 6. Through holes 64 are also provided in the light-transmissive resin film 52 in a manner to connect with those through holes 62, wherein the pins 8 of the ferrule 6 are inserted in those through holes 62 and 64.

Because the optical module 5 of the present embodiment has such a configuration, a small and inexpensive optical module can be provided. Also, by interposing the light-transmissive resin film 52, the optical element 50 and the ferrule 6 are separated from each other, such that influences of outside air and moisture from the side where the tape fiber 7 is disposed can be prevented, and the sealing property of the optical element can be improved. Next, a method for manufacturing the optical module 5 in accordance with the present embodiment is described.

Figure 7:
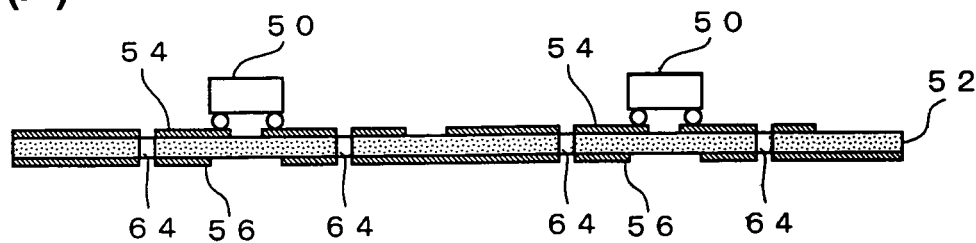
FIGS. 7(A)–7(E) are views for describing a method for manufacturing an optical module in accordance with the second embodiment.
Figure 7:
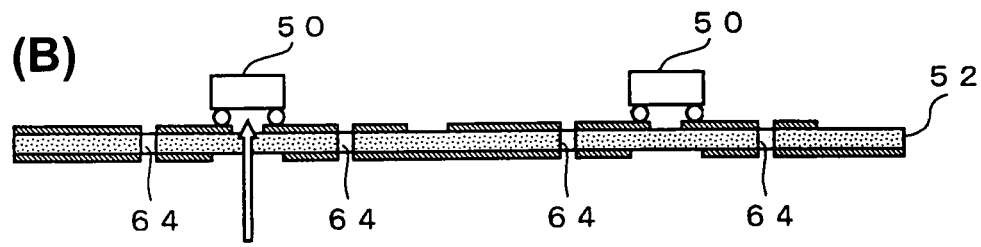
Figure 7:
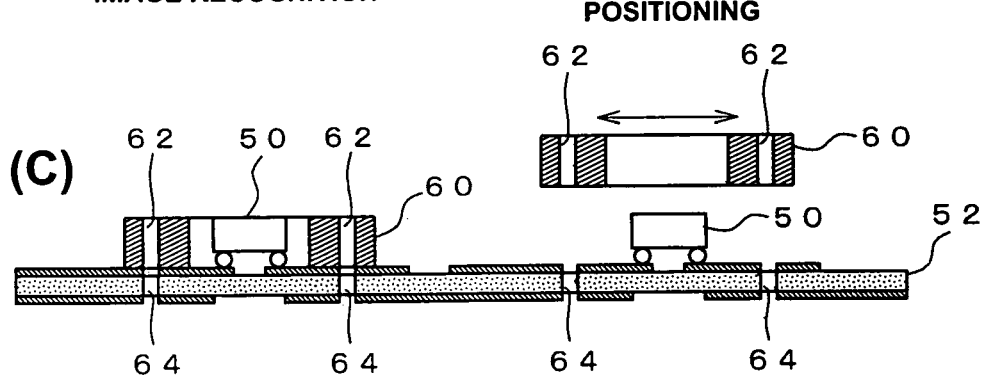
Figure 7:
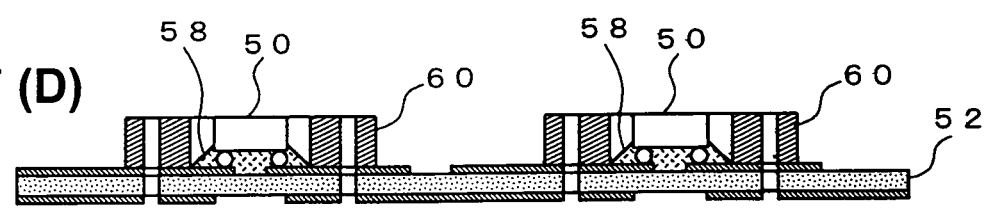
Figure 7:
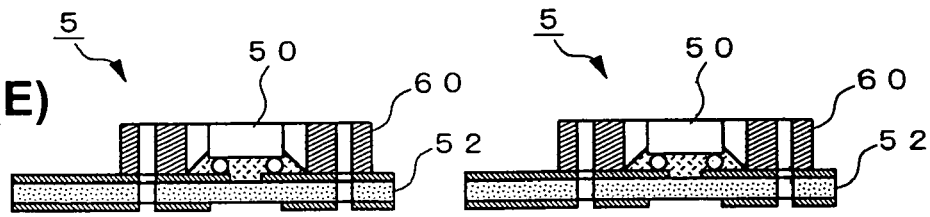

FIG. 7 are views for describing a method for manufacturing an optical module in accordance with the second embodiment. It is noted that descriptions of contents that duplicate with those of the first embodiments may be omitted.

Optical Element Mounting Step

As indicated in FIG. 7(A), a light-transmissive resin film 52 is prepared, and a plurality of optical elements 50 are mounted on one surface of the light-transmissive resin film 52.

Image Recognition Step

Next, as indicated in FIG. 7(B), an image recognition processing is conducted by imaging each of the optical elements 50 from the other surface side of the light-transmissive resin film 52 through the light-transmissive resin film 52, to detect a pattern position (configuration) of each of the optical elements 50. More preferably, the light emitting section or the photodetecting section of each of the optical elements 50 may be detected.

Receptacle Mounting Step

Next, as indicated in FIG. 7(C), by using the position of each of the optical elements 50 detected in the aforementioned step as a reference, mounting position is adjusted, and each of the receptacles 60 is attached to one surface of the light-transmissive resin film 52 such that each of the optical elements 50 is disposed inside the opening 63. Also, the receptacle 60 is positioned such that the through holes 62 of the receptacle 60 and the through holes 64 of the light-transmissive resin film 52 connect with one another. The receptacle 60 may be attached by, for example, thermocompression bonding with a thermosetting type adhesive sheet interposed between the receptacle 60 and the light-transmissive resin film 52, for example.

Underfill Material Forming Step

Next, as indicated in FIG. 7(D), underfill material 58 having a refractive index that is generally equal to that of the light-transmissive resin film 52 is filled in the opening 63 of the receptacle 60 and between the optical element 50 and the light-transmissive resin film 52.

Examining Step

Next, depending on the requirements, the operation of each of the optical elements 50 is checked (examined). The optical element 50 is supplied with electricity through each of the wiring films, thereby conducting a variety of desired examinations such as evaluation of light emitting condition, photodetecting condition, and the like. Because the examination is conducted prior to dividing the optical modules into individual pieces, the electricity can be supplied to each of the optical elements 50 together, and therefore the work required for evaluations can be substantially shortened. It is noted that, instead of supplying electricity together, electricity can be supplied individually to each of the optical elements 50 by using a probe or the like. Even in this case, the process can be readily accommodated to automation, such that the examination can be conducted in a shorter time compared to the case of an individual evaluation that is conducted after the optical modules 5 have been separated into individual pieces.

Cutting Step

Next, as indicated in FIG. 7(E), the light-transmissive resin film 52 is cut in regions corresponding to a plurality of the respective optical modules 5, in other words, in regions each including a pair of the optical element 50 and the receptacle 60, to obtain a plurality of the optical modules 5. Cutting in the present step can be conducted by dicing, laser cutting or the like. Through the steps described above, the optical module 5 in accordance with the present embodiment is completed.

Circuits (a signal transmission IC, a signal reception IC or the like) for driving the optical element 50 may be mounted for the optical module 5 described above, or the optical module 5 described above may be mounted on a circuit substrate having these circuits mounted thereon, to thereby compose an optical transceiver (an optical communication device). The optical module and the optical communication device in accordance with the present invention can be used for various types of electronic devices that perform data communications with external devices or the like using light as a transmission medium, such as, for example, personal computers, PDAs (portable information terminal devices) and the like.

It is noted that, according to the manufacturing method described above with reference to FIG. 7, the optical element 50 is first mounted, and then the configuration of the optical element 50 is recognized and the receptacle 60 is mounted while matching their relative positions. However, the order of mounting the optical element 50 and the receptacle 60 can be reversed. A manufacturing method in this case is described below.

Figure 8:
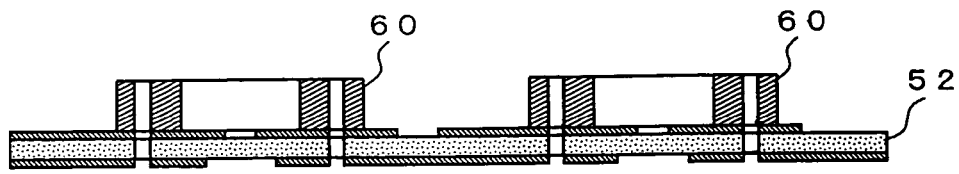
FIGS. 8(A)–8(E) are views for describing another example of a method for manufacturing an optical module in accordance with the second embodiment.
Figure 8:
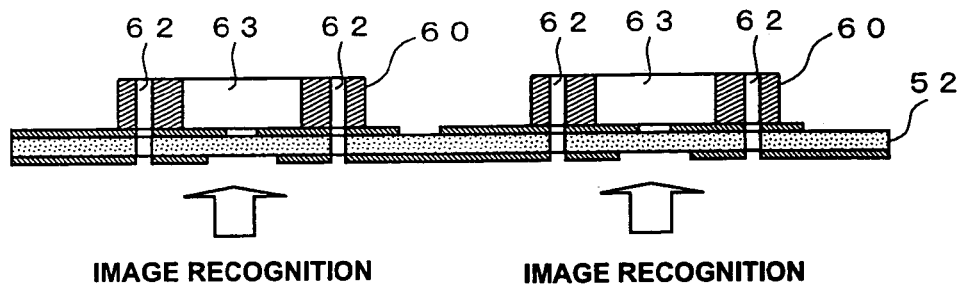
Figure 8:
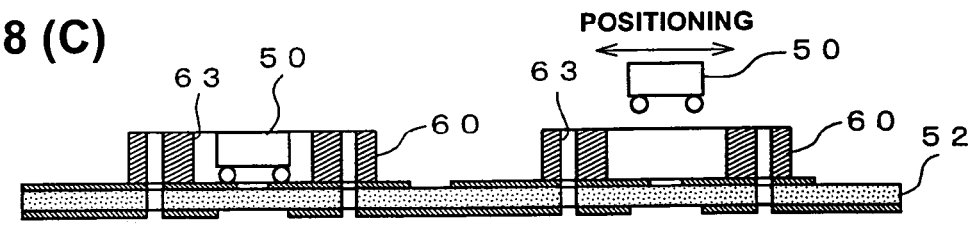
Figure 8:
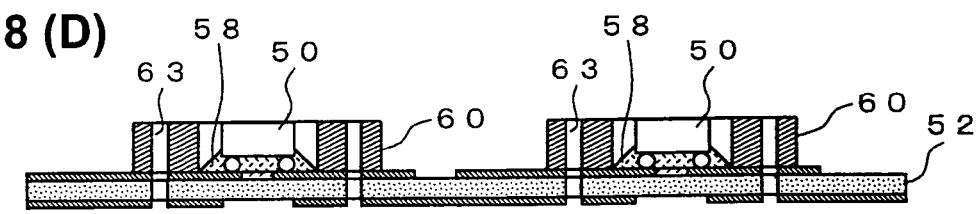
Figure 8:
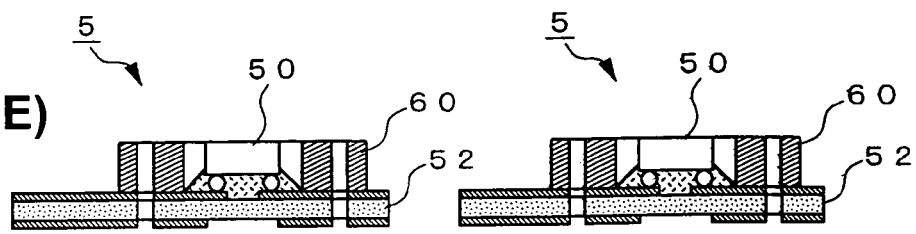

FIG. 8 are view for describing another example of the method for manufacturing an optical module in accordance with the second embodiment.

Sleeve Mounting Step

As indicated in FIG. 8(A), a light-transmissive resin film 52 is prepared, and a plurality of receptacles 60 are mounted on an upper surface (one surface) of the light-transmissive resin film 52.

Image Recognition Step

Next, as indicated in FIG. 8(B), an image recognition processing is conducted by imaging each of the receptacles 60 from a lower surface (the other surface) side of the light-transmissive resin film 52 through the light-transmissive resin film 52, to detect a pattern position (configuration) of each of the receptacles 60. As an object that is subject to the image recognition processing, any portion of the receptacle 60 may be detected as long as that portion can be used as a reference position at the time of mounting the optical element 10 later, but in particular, a through hole 62 of each of the receptacles 60 may preferably be detected. It is noted that an image recognition processing can be conducted by imaging the through hole 62 from the upper surface side of the light-transmissive resin film 52.

Optical Element Mounting Step

Next, as indicated in FIG. 8(C), by using the position of each of the receptacles 60 detected in the aforementioned step as a reference, mounting position is adjusted, and each of the optical elements 50 is attached to the one surface of the light-transmissive resin film 52 and in the opening 63 of each of the receptacles 60.

Underfill Material Forming Step

Next, underfill material 58 having a refractive index that is generally equal to that of the light-transmissive resin film 52 is filled in the opening 63 of the receptacle 60 and between the optical element 50 and the light-transmissive resin film 52.

Examination Step

Also, depending on the requirements, the operation of each of the optical elements 50 is checked (examined).

Cutting Step

Next, as indicated in FIG. 8(E), the light-transmissive resin film 52 is cut in regions corresponding to a plurality of the respective optical modules 5, in other words, in regions each including a pair of the optical element 50 and the receptacle 60, to obtain a plurality of the optical modules 5. By the manufacturing method described above, the optical module 5 in accordance with the present embodiment can be manufactured.

In this manner, in the manufacturing method in accordance with the present embodiments, multiple optical elements and supporting members corresponding to multiple optical modules are attached together to a light-transmissive resin film formed in a large sized sheet or the like, and they are finally cut into individual pieces, such that the multiple optical modules can be formed together. Accordingly, handling of parts such as optical elements is easier compared to the case where each individual optical module is manufactured through assembling parts that have already been made into individual pieces, and the time-consuming loading and unloading of light-transmissive resin films can be substantially eliminated, such that the manufacturing cost can be reduced. Also, the manufacturing method in accordance with the present invention can be readily accommodated to process automation, and therefore a lower cost can also be achieved in this respect.

Moreover, the manufacturing method in accordance with the present embodiment is readily accommodated to a so-called reel-to-reel system, in which the light-transmissive resin film is fed in one direction, and the respective steps described above are conducted in parallel at a plurality of locations along a feeding direction of the light-transmissive resin film. Although its illustration is omitted because it is similar to the case of the first embodiment described above (see FIG. 5), a light-transmissive resin film 52 may be fed intermittently or continuously in one direction, and the respective steps described above with reference to FIG. 7 or FIG. 8 are conducted in parallel at respective locations along the feeding direction. Also, if necessary, the underfill member forming step may be added after the optical element mounting step, and/or the examination step and the sealing member forming step may be added before the cutting step.

It is noted that the present invention is not limited to the contents of each of the embodiments described above, and many changes can be made and implemented within the scope of the subject matter of the present invention. For example, in the embodiments described above, the descriptions are made by enumerating, as examples, optical modules that do not include an additional circuit such as a driving circuit for driving an optical element or the like. However, the present invention can also be applied to optical modules that include such additional circuits.

What is claimed is:

1. A method for manufacturing an optical module having an optical element and a supporting member that supports one end of an optical path, disposed opposite to each other through a light-transmissive resin film, the method for manufacturing an optical module comprising:
   a first step of attaching a plurality of the optical elements to one surface of the light-transmissive resin film;
   a second step of detecting a position of each of the optical elements by conducting an image recognition processing through imaging each of the optical elements through the light-transmissive resin film from the side of another surface of the light-transmissive resin film;
   a third step of attaching a plurality of the supporting members on the other surface of the light-transmissive resin film while adjusting an attaching position thereof by using each of the positions of the optical elements detected in the second step as a reference; and
   a fourth step of obtaining a plurality of the optical modules through cutting the light-transmissive resin film in predetermined regions each including a pair of the optical element and the supporting member.

2. A method for manufacturing an optical module having an optical element and a supporting member that supports one end of an optical path, disposed opposite to each other through a light-transmissive resin film, the method for manufacturing an optical module comprising:
   a first step of attaching a plurality of the supporting members to one surface of the light-transmissive resin film;
   a second step of detecting a position of each of the supporting members by conducting an image recognition processing through imaging each of the supporting members through the light-transmissive resin film from the side of another surface of the light-transmissive resin film;
   a third step of attaching a plurality of the optical elements on the other surface of the light-transmissive resin film while adjusting an attaching position thereof by using each of the positions of the supporting members detected in the second step as a reference; and
   a fourth step of obtaining a plurality of the optical modules through cutting the light-transmissive resin film in predetermined regions each including a pair of the optical element and the supporting member.

3. A method for manufacturing an optical module according to claim 1, further comprising a fifth step of filling a refractive index matching material between the optical element and the light-transmissive resin film.

4. A method for manufacturing an optical module according to claim 1, further comprising a sixth step of forming a sealing member that entirely covers the optical element.

5. A method for manufacturing an optical module according to claim 4, wherein the light-transmissive resin film has a through hole near a position where the optical element and the supporting member are disposed, and the sealing member in the sixth step is formed extending to both of the surfaces of the light-transmissive resin film through the through hole, while covering the optical element and covering at least a part of the supporting member.

6. A method for manufacturing an optical module according to claim 1, further comprising a seventh step of examining an operation of each of the optical elements prior to the fourth step.

7. A method for manufacturing an optical module according to claim 1, wherein the light-transmissive resin film is fed in one direction, and the respective steps are conducted in parallel at a plurality of locations along a feeding direction of the light-transmissive resin film.

8. A method for manufacturing an optical module according to claim 2, further comprising a fifth step of filling a refractive index matching material between the optical element and the light-transmissive resin film.

9. A method for manufacturing an optical module according to claim 2, further comprising a sixth step of forming a sealing member that entirely covers the optical element.

10. A method for manufacturing an optical module according to claim 9, wherein the light-transmissive resin film has a through hole near a position where the optical element and the supporting member are disposed, and the sealing member in the sixth step is formed extending to both of the surfaces of the light-transmissive resin film through the through hole, while covering the optical element and covering at least a part of the supporting member.

11. A method for manufacturing an optical module according to claim 2, wherein the light-transmissive resin film is fed in one direction, and the respective steps are conducted in parallel at a plurality of locations along a feeding direction of the light-transmissive resin film.

12. A method for manufacturing an optical module including a supporting member that supports one end of an optical path, an optical element disposed in an opening defined in the supporting member, and a light-transmissive resin film having one surface on which the supporting member and the optical element are disposed, the method for manufacturing an optical module comprising:
   a first step of attaching a plurality of the optical elements to one surface of the light-transmissive resin film;
   a second step of detecting a position of each of the optical elements by conducting an image recognition processing through imaging each of the optical elements through the light-transmissive resin film from the side of another surface of the light-transmissive resin film;
   a third step of attaching a plurality of the supporting members on the other surface of the light-transmissive resin film while adjusting an attaching position thereof by using each of the positions of the optical elements detected in the second step as a reference; and
   a fourth step of obtaining a plurality of the optical modules through cutting the light-transmissive resin film in predetermined regions each including a pair of the optical element and the supporting member.

13. A method for manufacturing an optical module including a supporting member that supports one end of an optical path, an optical element disposed in an opening defined in the supporting member, and a light-transmissive resin film having one surface on which the supporting member and the optical element are disposed, the method for manufacturing an optical module comprising:
   a first step of attaching a plurality of the supporting members to one surface of the light-transmissive resin film;
   a second step of detecting a position of each of the supporting members by conducting an image recognition processing through imaging each of the supporting members through the light-transmissive resin film from the side of another surface of the light-transmissive resin film;
   a third step of attaching the optical element on the other surface of the light-transmissive resin film and in each of the openings of the plurality of supporting members while adjusting an attaching position thereof by using each of the positions of the supporting members detected in the second step as a reference; and a fourth step of obtaining a plurality of the optical modules through cutting the light-transmissive resin film in predetermined regions each including a pair of the optical element and the supporting member.

14. A method for manufacturing an optical module according to claim 12, further comprising a fifth step of filling a refractive index matching material between the optical element and the light-transmissive resin film within the opening of the supporting member.

15. A method for manufacturing an optical module according to claim 12, further comprising a sixth step of examining an operation of each of the optical elements prior to the fourth step.

16. A method for manufacturing an optical module according to claim 12, wherein the light-transmissive resin film is fed in one direction, and the respective steps are conducted in parallel at a plurality of locations along a feeding direction of the light-transmissive resin film.

17. A method for manufacturing an optical module according to claim 13, further comprising a fifth step of filling a refractive index matching material between the optical element and the light-transmissive resin film within the opening of the supporting member.

18. A method for manufacturing an optical module according to claim 13, further comprising a sixth step of examining an operation of each of the optical elements prior to the fourth step.

19. An optical communication device equipped with an optical module manufactured by the manufacturing method according to claim 1.

20. An electronic device equipped with an optical module manufactured by the manufacturing method according to claim 1.

* * * * *